(12) United States Patent
Wang

(10) Patent No.: US 9,214,927 B2
(45) Date of Patent: Dec. 15, 2015

(54) RELAXATION OSCILLATOR

(71) Applicant: Zhengxiang Wang, Suzhou (CN)

(72) Inventor: Zhengxiang Wang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/556,220

(22) Filed: Nov. 30, 2014

(65) Prior Publication Data

US 2015/0270832 A1    Sep. 24, 2015

(30) Foreign Application Priority Data

Mar. 19, 2014  (CN) .......................... 2014 1 0186057

(51) Int. Cl.
*H03K 3/0231* (2006.01)
*H03K 4/501* (2006.01)
*H03K 3/0233* (2006.01)
*H03K 3/012* (2006.01)

(52) U.S. Cl.
CPC .............. *H03K 4/501* (2013.01); *H03K 3/0231* (2013.01); *H03K 3/0233* (2013.01); *H03K 3/012* (2013.01)

(58) Field of Classification Search
CPC ....... H03K 3/0231; H03K 4/50; H03K 4/501; H03K 4/502
USPC .................................................. 331/111, 143
See application file for complete search history.

(56) References Cited

U.S. PATENT DOCUMENTS

| | | |
|---|---|---|
| 4,535,305 A | 8/1985 | Matsuo |
| 6,020,792 A | 2/2000 | Nolan |
| 6,614,313 B2 | 9/2003 | Crofts |
| 6,680,656 B2 | 1/2004 | Chen |
| 7,109,804 B2 | 9/2006 | Mader |
| 7,135,937 B2 | 11/2006 | Mitsuda |
| 7,733,191 B2 | 6/2010 | Olmos |
| 7,847,648 B2 | 12/2010 | Hu |
| 8,054,141 B2 | 11/2011 | Saw |
| 8,350,631 B1 | 1/2013 | Wadhwa |
| 8,390,384 B1 | 3/2013 | Daryanani |
| 8,508,306 B2 | 8/2013 | Choe |
| 8,643,443 B1 | 2/2014 | Wang |
| 8,749,275 B2 * | 6/2014 | Inoue .................. H03F 3/45192 327/563 |
| 8,860,517 B2 * | 10/2014 | Giacomini ............. H03K 3/011 331/111 |
| 9,007,137 B2 * | 4/2015 | Inoue ....................... H03K 3/36 327/182 |
| 2011/0001572 A1 | 1/2011 | Shahparnia |

* cited by examiner

*Primary Examiner* — Ryan Johnson
(74) *Attorney, Agent, or Firm* — Charles Bergere

(57) ABSTRACT

A relaxation oscillator shares charging current and comparator biasing current between just two current sources, thereby relaxing requirements on total supply current. The resulting reduction in power consumption has no adverse effect on the speed and accuracy of the oscillator. A switching arrangement directs charging and biasing currents between the two current sources and two charging capacitors and their associated comparators.

19 Claims, 4 Drawing Sheets

US 9,214,927 B2

RELAXATION OSCILLATOR

BACKGROUND OF THE INVENTION

The present invention relates generally to generation of clock signals for integrated circuits, and, more particularly to comparators and relaxation oscillators that use comparators.

Relaxation oscillator circuits are found in many electronic circuit applications and often are used for generating clock signals that control the timing of such electronic circuits. For example, relaxation oscillator circuits can be used in DC/DC converters, counters, shifters, microcontrollers, and modulation circuitry. Typically, the period of the clock signal provided by a relaxation oscillator circuit is determined primarily by the charging and discharging of two capacitors.

FIG. 1 shows a known relaxation oscillator circuit that has a reference voltage Vref, a first current source 101 that supplies charging current to a first capacitor 102, a first capacitor switch 103, a second current source 104 that supplies charging current to a second capacitor 105, a second capacitor switch 106, a first comparator 107, a second comparator 108 and a flip-flop 109 that provides an output clock signal. Third and fourth current sources 110 and 111 supply bias currents to the first and second comparators 107, 108 respectively. By operation of the first switch 103, the first capacitor 102 is charged during a first half-cycle of the output clock signal and discharged during a second half-cycle of the output clock signal. By operation of the second switch 106, the second capacitor 105 is charged during the second half-cycle of the output clock cycle and discharged during the first half-cycle of the output clock signal. The first comparator 107 is arranged to provide an output by continuously comparing the voltage across the first capacitor to the reference voltage Vref. The second comparator 108 is arranged to provide an output by continuously comparing the voltage across the second capacitor to the reference voltage Vref. The flip-flop 109 has Q and /Q outputs that generate the output clock signal CLK and an inverted output clock signal /CLK, which are provided to the comparators. The output clock signals CLK and /CLK operate the second and first switches 106, 103, respectively.

Power consumption of such a typical relaxation oscillator is relatively high because of the presence of the four current sources 101, 104, 110, and 111, which are required to be active for all charging and discharging phases of the capacitors 102 and 105. Moreover, in order to achieve good accuracy of the clock period, the response speed of the comparators should be sufficiently fast. This requires more power, which might not be acceptable in low power applications. It therefore would be advantageous to provide a relaxation oscillator that consumes less power.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
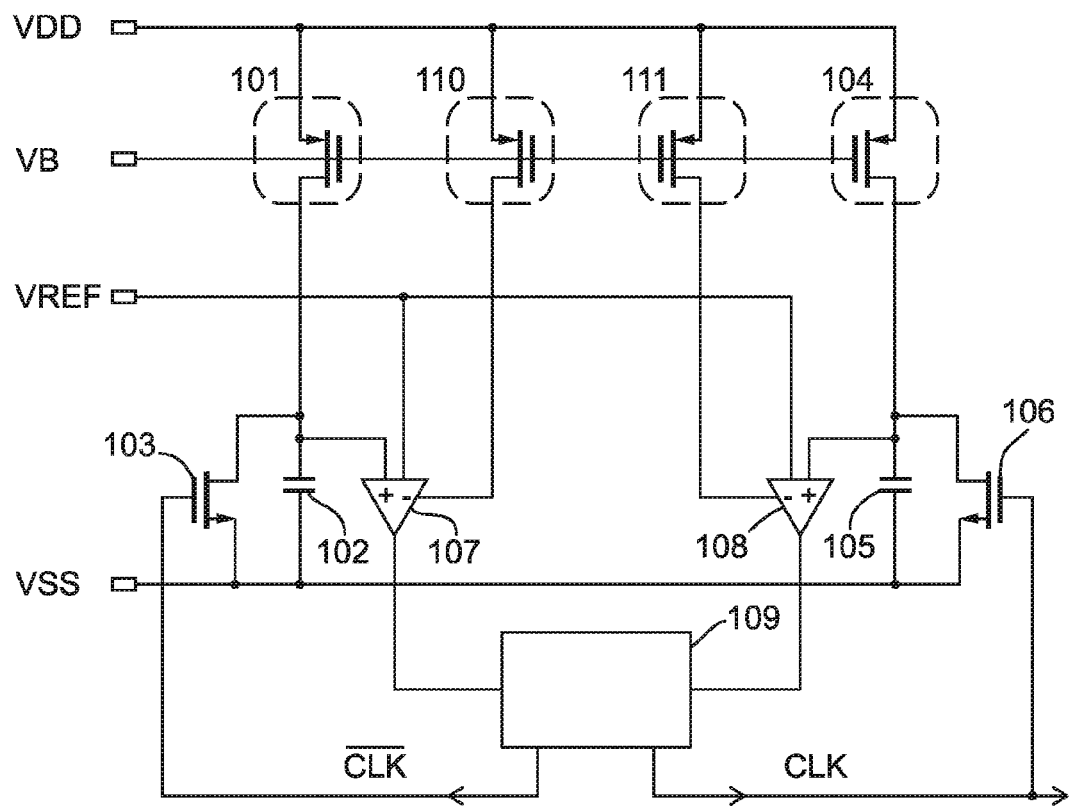
FIG. 1 is a simplified circuit diagram of a known relaxation oscillator circuit.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an oscillator circuit comprising a flip-flop for generating a clock signal, first and second capacitors, and first and second comparators for comparing a voltage across the first and second capacitors respectively with a reference voltage. Each of the comparators has an output connected to an input of the flip-flop. A switching circuit is connected to an output of the flip-flop. The switching circuit is arranged to direct, on a first half cycle of the clock signal, a charging current to the first capacitor from a first current source and to direct a biasing current to the first comparator from a second current source. On a second half cycle of the clock signal, the switching circuit is arranged to direct a charging current to the second capacitor from the second current source and to direct a biasing current to the second comparator from the first current source.

In another embodiment, the present invention provides an oscillator circuit comprising a flip-flop for generating a clock signal, first and second capacitors, and first and second comparators for comparing a voltage across the first and second capacitors respectively with a reference voltage. Each of the comparators has an output connected to an input of the flip-flop. A switching circuit is connected to an output of the flip-flop. The switching circuit is arranged to direct, on a first half cycle of the clock signal, a charging current to the first capacitor from a first current source and to direct a biasing current to the first comparator from a second current source. On a second half cycle of the clock signal, the switching circuit is arranged to direct a charging current to the second capacitor from the first current source and to direct a biasing current to the second comparator from the second current source.

Thus, in some embodiments, when supplied charging current is not actually being used for charging, it is instead, steered into one of the comparators as a biasing current, in contrast with known arrangements where such charging current is conducted to ground.

Figure 2:
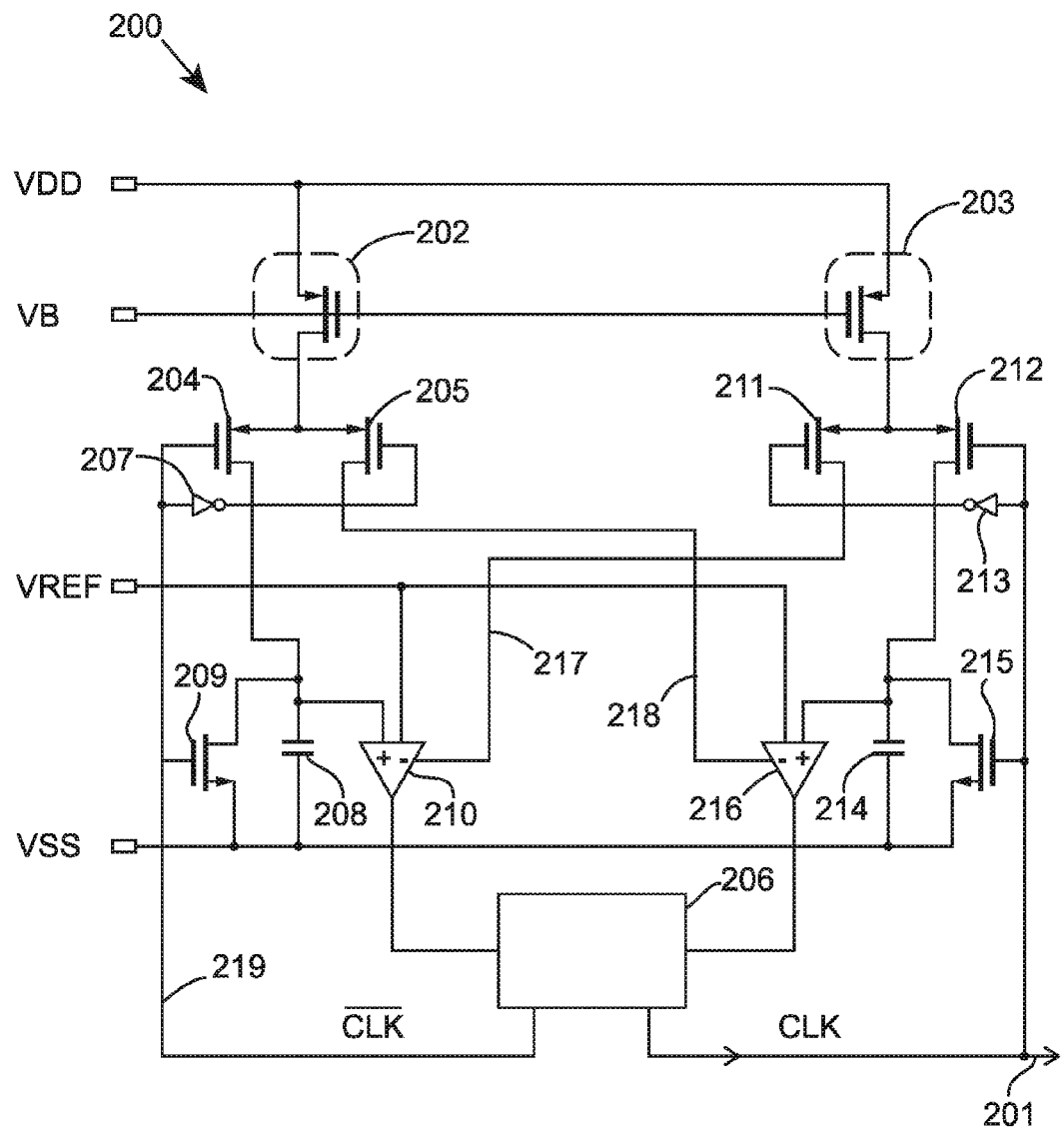
FIG. 2 is a simplified circuit diagram of a relaxation oscillator circuit in accordance with a first embodiment of the present invention.

Referring now to FIG. 2, a first example of a relaxation oscillator circuit 200 for providing a clock signal CLK on an output line 201 is shown. The clock signal on the line 201 may be used in an electronic circuit device (not shown) and in some embodiments the relaxation oscillator circuit 200 may be included in such a device.

A first current source 202 comprising a P-channel MOSFET (metal oxide semiconductor field effect transistor) and a second current source 203 also comprising a PMOSFET both have their source terminals connected to a supply voltage VDD and their gate terminals connected together and to a bias voltage VB. A drain terminal of the first current source 202 is connected to first and second switches 204, 205. Each of the first and second switches 204, 205 comprises a PMOSFET. Source terminals of the first and second switches 204, 205 are connected to the drain terminal of the PMOSFET comprising the first current source 202. A gate terminal of the first switch 204 receives an inverted version of the clock signal (/CLK) output from a flip-flop 206. A gate terminal of the second switch 205 receives the inverted clock signal from the flip-flop 206 by way of a first inverter 207. A drain terminal of the first switch 204 is connected to a first terminal of a first charging capacitor 208. A second terminal of the first charging capacitor 208 is connected to supply voltage VSS (which may be grounded). A third switch 209 is connected across the first charging capacitor 208. The third switch 209 comprises an N-channel MOSFET having a drain terminal connected to the drain terminal the first switch 204, a source terminal connected to the supply voltage VSS and a gate terminal connected to the inverted output of the flip-flop 206 (i.e., /CLK). Operation of both of the first and third switches 204, 209, and therefore the charging and discharging of the first capacitor 208, is thus controlled by the inverted clock signal (/CLK). The first terminal of the first capacitor 208 is also connected to the non-inverting input of a first comparator 210. The inverting input of the first comparator 210 is connected to a reference voltage source VREF. The first comparator 210 compares the voltage across the first capacitor 208 with the reference voltage VREF. An output of the first comparator 210 is connected to a first input of the flip-flop 206. In the embodiment shown, the flip-flop 206 comprises an SR flip-flop (or latch) and the output of the first comparator 210 is connected to the R input terminal, the clock signal CLK is generated at the Q output, and the inverted clock signal /CLK is generated at the /Q output.

A drain terminal of the second current source 203 is connected to fourth and fifth switches 211, 212. Each of the fourth and fifth switches 211, 212 comprises a PMOSFET whose source terminals are connected to the drain terminal of the second current source 203. A gate terminal of the fourth switch 211 receives the clock signal CLK from the flip-flop 206 by way of a second inverter 213, and a gate terminal of the fifth switch 212 receives the clock signal CLK from the flip-flop 206. A drain terminal of the fifth switch 212 is connected to a first terminal of a second charging capacitor 214. A second terminal of the second charging capacitor 214 is connected to the supply voltage VSS. A sixth switch 215 is connected across the second capacitor 214. In the embodiment shown, the sixth switch 214 comprises an NMOSFET having a drain terminal connected to the drain terminal of the fifth switch 212, a source terminal connected to VSS and a gate terminal connected to the Q output of the flip-flop 206 for receiving the clock signal CLK. Operation of both of the fifth and sixth switches 212, 215, and therefore the charging and discharging of the second capacitor 214, is therefore controlled by the clock signal CLK output by the flip-flop 206.

The first terminal of the second capacitor 214 is also connected to the non-inverting input of a second comparator 216. The inverting input of the second comparator 216 is connected to the reference voltage source VREF. Hence, the second comparator 216 compares the voltage across the second capacitor 214 with VREF. An output of the second comparator 216 is connected to the S input terminal of the flip-flop 206.

The drain terminal of the fourth switch 211 supplies a first bias (or "tail") current on line 217 to the first comparator 210 and the drain terminal of the second switch 205 supplies a second bias current to the second comparator 216 on a line 218. Hence a supply of bias current to each comparator 210 216 also is controlled by the clock signal (or inverted clock signal) output by the flip-flop 206.

By operation of the third switch 209, the first capacitor 208 charges up in a first half-cycle of the clock signal CLK and discharges in a second half-cycle of the clock signal CLK. By operation of the sixth switch 215 the second capacitor 214 charges up in the second half-cycle of the clock signal CLK and discharges in the first half-cycle of the clock signal CLK. The first comparator 210 toggles when the voltage across the first capacitor 208 reaches the reference voltage VREF and the second comparator 216 toggles when the voltage across the second capacitor 214 reaches the reference voltage VREF. The flip-flop 206 is either set or reset by the outputs of one or other of the comparators and so generates the clock signal CLK and the inverted clock signal /CLK on its output lines 201 and 219 (Q and /Q) respectively. The clock signal and the inverted clock signal output by the flip-flop 206 operate the sixth and third switches 215, 209 respectively.

As mentioned above, the clock signal output by the flip-flop 206 also controls the first, second, fourth and fifth switches, 204, 205, 211, 212 and so control of application of charging current to the two capacitors 208, 214 and application of the first and second bias currents provided to the first and second comparators 210, 216.

Still with reference to FIG. 2, as an example of operation, say that in a first half cycle of the clock signal output by the flip-flop 206, the third switch 209 is open, the first switch 204 is closed and the second switch 205 is open. Also during the first half cycle, the sixth switch 215 is closed, the fifth switch 212 is open and the fourth switch 211 is closed. Therefore, charging current will flow from the first current source 202 through the first capacitor 208. The second capacitor will discharge to VSS via the sixth switch 215, which is closed. Also, the first bias current will be provided to the first comparator 210 from the second current source 203. No charging current will be supplied to the second capacitor 214 and no bias current will be supplied to the second comparator 216. In the second half cycle of the clock signal, the third switch 209 is closed, the first switch 204 is open and the second switch 205 is closed. Also during the second half cycle, the sixth switch 215 is open, the fifth switch 212 is closed and the fourth switch 211 is open. Therefore, charging current will flow from the second current source 203 through the second capacitor 214. The first capacitor 206 will discharge to VSS through the third switch 209, which is closed. Also, the second bias current will be provided to the second comparator 216 from the first current source 202. No current will be supplied to the first capacitor 208 and the first bias current will not be supplied to the first comparator 210.

Thus, in cases where the required charging current for each capacitor 208, 214 equals the required bias current for each comparator 210, 216, by using a first charging current to bias the second comparator 216 (and using a second charging current to bias the first comparator 210), there is no need for any additional bias current sources.

Figure 3:
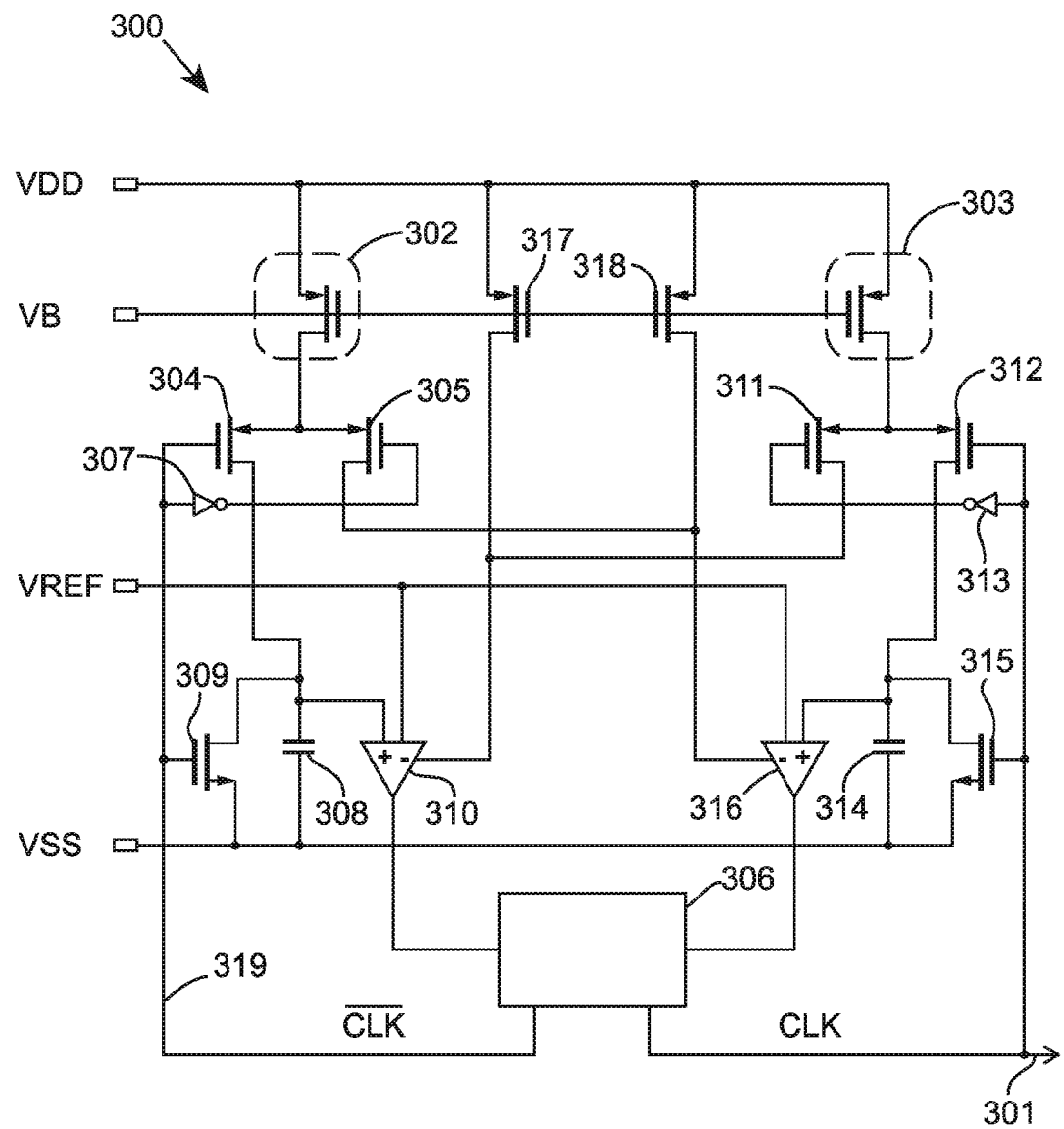
FIG. 3 is a is a simplified circuit diagram of a relaxation oscillator circuit in accordance with a second embodiment of the present invention.

Referring now to FIG. 3, a second example of a relaxation oscillator circuit 300 for providing a clock signal CLK on an output line 301 is shown. The clock signal on line 301 is suitable for use in an electronic circuit device (not shown) and in some embodiments the relaxation oscillator circuit 300 may be included in such a device. The relaxation oscillator circuit of this second embodiment shares some common features with that of the first embodiment. More specifically, as will be described in more detail below, the main difference between the relaxation oscillator 300 and the relaxation oscillator 200 is the generation of supplementary bias currents for the comparators (310, 316) using additional current sources (317, 318).

A first current source 302 comprising a PMOSFET and a second current source 303 also comprising a PMOSFET both have their source terminals connected to a supply voltage VDD and their gate terminals connected to a bias voltage VB. A drain terminal of the first current source 302 is connected to first and second switches 304, 305. Each of the first and second switches 304, 305 comprises a PMOSFET. Source terminals of the first and second switches 304, 305 are connected to the drain terminal of the PMOSFET comprising the first current source 302. A gate terminal of the first switch 304 receives an inverted clock signal output /CLK from a flip-flop 306. A gate terminal of the second switch 305 receives the inverted clock signal /CLK from the flip-flop 306 by way of a first inverter 307. A drain terminal of the first switch 304 is connected to a first terminal of a first charging capacitor 308. A second terminal of the first charging capacitor 308 is connected to a supply voltage VSS (which may be grounded). A third switch 309 is connected across the capacitor 308. The third switch 309 comprises an NMOSFET having a drain terminal connected to the drain terminal the first switch 304, a source terminal connected to VSS and a gate terminal connected to the inverted output (/Q) of the flip-flop 306. Operation of both of the first and third switches 304, 309, and therefore the charging and discharging of the first capacitor 308, is thus controlled by the inverted clock signal /CLK output by the flip-flop 306. The first terminal of the first capacitor 308 is also connected to the non-inverting input of a first comparator 310. The inverting input of the first comparator 310 is connected to a reference voltage source VREF. Hence, the first comparator 310 compares the voltage across the first capacitor 308 with VREF. An output of the first comparator 310 is connected to a first input of the flip-flop 306. In the embodiment shown, the flip-flop 306 comprises an SR flip-flop and the output of the first comparator 310 is connected to the R input terminal of the flip-flop 306, the clock signal CLK is provided at the Q output, and the inverted clock signal /CLK is provided at the /Q output.

A drain terminal of the second current source 303 is connected to fourth and fifth switches 311, 312. Each of the fourth and fifth switches 311, 312 comprises a PMOSFET whose source terminals are connected to the drain terminal of the second current source 303. A gate terminal of the fourth switch 311 receives the clock signal output by the flip-flop 306 by way of a second inverter 313. A gate terminal of the fifth switch 312 receives the clock signal output by the flip-flop 306. A drain terminal of the fifth switch 312 is connected to a first terminal of a second charging capacitor 314. A second terminal of the second charging capacitor 314 is connected to the supply voltage VSS. A sixth switch 315 is connected across the second capacitor 314. The sixth switch 315 comprises an NMOSFET having a drain terminal connected to the drain terminal of the fifth switch 312, a source terminal connected to VSS and a gate terminal connected to the clock signal CLK output by the flip-flop 306. Operation of both of the fifth and sixth switches 312, 315, and therefore the charging and discharging of the second capacitor 314, is therefore controlled by the clock output of the flip-flop 306.

A first terminal of the second capacitor 314 is also connected to the non-inverting input of a second comparator 316. The inverting input of the second comparator 316 is connected to the reference voltage VREF. Hence, the second comparator 316 compares the voltage across the second capacitor 314 with VREF. An output of the second comparator 316 is connected to a second input of the flip-flop 306 (i.e., the S input terminal of the flip-flop).

The drain terminal of the fourth switch 311 supplies a first supplementary bias current to the first comparator 310 and the drain terminal of the second switch 305 supplies a second supplementary bias current to the second comparator 316. Hence a supply of bias current to each of the comparators 310, 316 is also controlled by the clock (or inverted clock) signal output by the flip-flop 306.

A third current source 317 provides a first bias current to the first comparator 310. The third current source 317 comprises a PMOSFET having a source terminal connected to VDD, a gate terminal connected to VB and a drain terminal connected (with the drain of the fourth switch 311) to the first comparator 310.

A fourth current source 318 provides a second bias current to the second comparator 316. The fourth current source 318 comprises a PMOSFET having a source terminal connected to VDD, a gate terminal connected to VB and a drain terminal connected (with the drain of the second switch 305) to the second comparator 316.

In a similar fashion to the first embodiment, by operation of the third switch 309, the first capacitor 308 charges up in a first half-cycle of the clock signal and discharges in a second half-cycle of the clock signal. By operation of the sixth switch 315 the second capacitor 314 charges up in the second half-cycle of the clock signal and discharges in the first half-cycle of the clock signal. The first comparator 310 toggles when the voltage across the first capacitor 308 reaches the reference voltage VREF and the second comparator 316 toggles when the voltage across the second capacitor 314 reaches the reference voltage VREF. The flip-flop 306 is either set or reset by the outputs of one or the other of the comparators 310, 316 and so generates the clock signal CLK and the inverted clock signal /CLK on its output lines 301 and 319 respectively. The clock signal CLK and the inverted clock signal /CLK operate the sixth and third switches 315, 309 respectively.

The outputs of the flip-flop 306 also control the first, second, fourth and fifth switches, 304, 305, 311, 312 and so control application of charging current to the two capacitors 308, 314 and the application of supplementary bias currents to the comparators 310, 316.

As an example of operation of the second embodiment, say that in a first half cycle of the clock signal CLK, the third switch 309 is open, the first switch 304 is closed and the second switch 305 is open. Also during the first half cycle, the sixth switch 315 is closed, the fifth switch 312 is open and the fourth switch 311 is closed. Therefore, charging current will flow from the first current source 302 through the first capacitor 308. Also, a bias current will be provided to the first comparator 310 from the second current source 303 and from the third current source 317. The second capacitor 314 will discharge to VSS through the sixth switch 315, which is closed. Only the (second) bias current from the fourth current source 318 is supplied to the second comparator 316. In the second half cycle of the clock signal, the third switch 309 is closed, the first switch 304 is open and the second switch 305 is closed. Also during the second half cycle, the sixth switch 315 is open, the fifth switch 312 is closed and the fourth switch 311 is open. Therefore, charging current will flow from the second current source 303 through the second capacitor 314. Also, the bias current will be provided to the second comparator 316 from the first current source 302 and from the fourth current source 318. The first capacitor 308 will discharge to VSS through the third switch 309, which is closed. Only the first supplementary bias current from the third current source 317 will be supplied to the first comparator 310.

Thus, in cases where the bias current required by the comparators 310, 316 is greater than the charging current required for each capacitor, the charging currents may be used to supplement the bias currents, thereby relaxing the requirements on each bias current source, i.e., the third and fourth current sources 317, 318.

Figure 4:
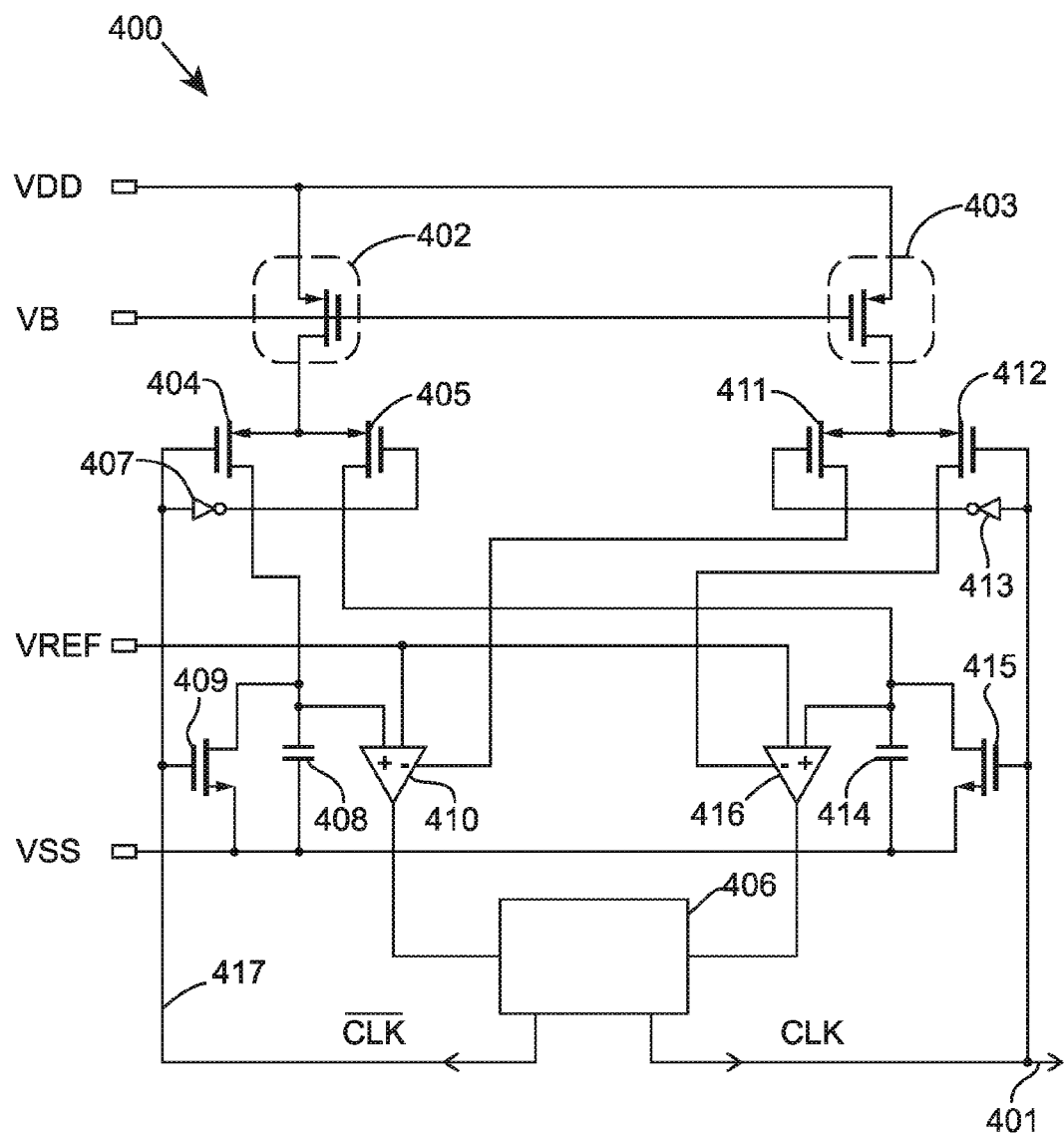
FIG. 4 is a simplified circuit diagram of a relaxation oscillator circuit in accordance with a third embodiment of the present invention.

Referring now to FIG. 4, a third example of a relaxation oscillator circuit 400 for providing a clock signal CLK on an output line 401 is shown. The clock signal CLK on the line 401 is suitable for use in an electronic circuit device (not shown) and in some embodiments the relaxation oscillator circuit 400 may be included in such a device. The relaxation oscillator 400, which will be described in detail below, is similar to the relaxation oscillator 200 (FIG. 2) except that the second capacitor is charged by way of a second switch (instead of by way of the fifth switch 212 in FIG. 2), and the second bias current to the second comparator is provided by way of a fifth switch (instead of by way of the second switch 205 of FIG. 2).

A first current source 402 comprising a PMOSFET and a second current source 403 also comprising a PMOSFET both have their source terminals connected to a supply voltage VDD and their gate terminals connected to a bias voltage VB. A drain terminal of the first current source 402 is connected to first and second switches 404, 405. Each of the first and second switches 404, 405 comprises a PMOSFET. Source terminals of the first and second switches 404, 405 are connected to the drain terminal of the PMOSFET comprising the first current source 402. A gate terminal of the first switch 404 receives an inverted clock signal /CLK output by a flip-flop 406. A gate terminal of the second switch 405 receives the inverted clock signal /CLK from the flip-flop 406 by way of a first inverter 407. A drain terminal of the first switch 404 is connected to a first terminal of a first charging capacitor 408 whose second terminal is connected to a supply voltage VSS (which may be grounded). A third switch 409 is connected across the capacitor 408. The third switch 409 comprises an NMOSFET having a drain terminal connected to the drain terminal the first switch 404, a source terminal connected to VSS and a gate terminal connected to the inverted clock signal /CLK output by the flip-flop 406. Operation of both of the first and third switches 404, 409, and therefore the charging and discharging of the first capacitor 408, is thus controlled by the inverted clock signal /CLK output by the flip-flop 406. The first terminal of the first capacitor 408 is also connected to the non-inverting input of a first comparator 410. The inverting input of the first comparator 410 is connected to a reference voltage VREF. Hence, the first comparator 410 compares the voltage across the first capacitor 408 with VREF. An output of the first comparator 410 is connected to a first input of the flip-flop 406. In the embodiment shown, the flip-flop 406 comprises an SR flip-flop and the output of the first comparator 410 is connected to the reset terminal R of the flip-flop 406, the clock signal CLK (line 401) is generated at the Q output terminal, and the inverted clock signal /CLK (line 417) is generated at the /Q terminal.

A drain terminal of the second current source 403 is connected to fourth and fifth switches 411, 412. Each of the fourth and fifth switches 411, 412 comprises a PMOSFET whose source terminals are connected to the drain terminal of the second current source 403. A gate terminal of the fourth switch 411 receives the clock signal CLK from the flip-flop 406 by way of a second inverter 413. A gate terminal of the fifth switch 412 receives the clock signal CLK output by the flip-flop 406. A drain terminal of the second switch 405 is connected to a first terminal of a second charging capacitor 414 whose second terminal is connected to the supply voltage VSS (ground). A sixth switch 415 is connected across the second capacitor 414. The sixth switch 414 comprises an NMOSFET having a drain terminal connected to the drain terminal of the second switch 405, a source terminal connected to VSS and a gate terminal connected to the clock signal CLK output by the flip-flop 406. Operation of the second and sixth switches 405, 415 and therefore the charging and discharging of the second capacitor 414 is therefore controlled by the outputs of the flip-flop 406.

The first terminal of the second capacitor 414 is also connected to the non-inverting input of a second comparator 416. The inverting input of the second comparator 416 is connected to the reference voltage VREF. Hence, the second comparator 416 compares the voltage across the second capacitor 414 with VREF. An output of the second comparator 416 is connected to a second input (i.e., the set or S terminal) of the flip-flop 406.

The drain terminal of the fourth switch 411 supplies a first bias (or "tail") current to the first comparator 410 and the drain terminal of the fifth switch 412 supplies a second bias current to the second comparator 416. Hence a supply of bias current to each of the comparators 410, 416 is also controlled by the outputs of the flip-flop 406.

By operation of the third switch 409, the first capacitor 408 charges up in a first half-cycle of the clock signal CLK and discharges in a second half-cycle of the clock signal. By operation of the sixth switch 415 the second capacitor 414 charges up in the second half-cycle of the clock signal and discharges in the first half-cycle of the clock signal. The first comparator 410 toggles when the voltage across the first capacitor 408 reaches the reference voltage VREF and the second comparator 416 toggles when the voltage across the second capacitor 414 reaches the reference voltage VREF. The flip-flop 406 is either set or reset by the outputs of one or the other of the comparators 410, 416 and so generates the clock signal CLK and the inverted clock signal /CLK on its output lines 401 and 417 respectively. The flip-flop's CLK output and inverted clock output /CLK operate the sixth and third switches 415, 409 respectively.

As mentioned above, the clock outputs of the flip-flop 406 also control the first, second, fourth and fifth switches, 404, 405, 411, 412 and so control application of charging current to the two capacitors 408, 414 and the application of the bias currents provided to the comparators 410, 416.

Still with reference to FIG. 4, as an example of operation, say that in a first half cycle of the clock signal CLK, the third switch 409 is open, the first switch 404 is closed and the second switch 405 is open. Also during the first half cycle, the sixth switch 415 is closed, the fifth switch 412 is open and the fourth switch 411 is closed. Therefore, charging current flows from the first current source 402 through the first capacitor 408. Also, a first bias current is provided to the first comparator 410 from the second current source 403. The second capacitor 414 will discharge to VSS through the sixth switch 415. No bias current is supplied to the second comparator 416. In the second half cycle of the clock signal, the third switch 409 is closed, the first switch 404 is open and the second switch 405 is closed. Also during the second half cycle, the sixth switch 415 is open, the fifth switch 412 is closed and the fourth switch 411 is open. Therefore, charging current flows from the first current source 402 through the second capacitor 414. Also, a second bias current is provided to the second comparator 416 from the second current source 403. The first capacitor 408 will discharge to VSS through the third switch 409. No bias current is supplied to the first comparator 410.

Thus, in any case, just two current sources may be used, one for charging one or the other of the capacitors 408, 414 on alternate clock phases and another for biasing one or the other of the comparators 410, 416 on alternate clock phases. These two currents may have separate minimal values that are determined by the required accuracy and speed of the clock signal.

Advantageously, the present invention provides a relaxation oscillator with reduced power requirements but without sacrificing accuracy or speed. A relaxation oscillator in accordance with the invention can have a speed and accuracy comparable with known relaxation oscillators that require separate and continuous current sources for supplying both charging capacitor currents and both comparator bias currents. Furthermore, a relaxation oscillator in accordance with the invention outputs a clock signal with a given frequency yet consuming about half as much power as the known arrangement of FIG. 1 operating at the same frequency.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. For example, P channel devices may be replaced with N channel devices and vice-versa with the appropriate supply voltage polarities being adjusted to suit.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks and circuit elements are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. Further, the entire functionality of the circuit elements shown in FIGS. 2, 3 and 4 may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and that are connectable to other components outside the package through suitable connections such as pins of the package and bond wires between the pins and the dies.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An oscillator circuit, comprising:
a flip-flop for generating a clock signal at an output thereof;
first and second current sources;
first and second capacitors;
first and second comparators for comparing a voltage across the first and second capacitors respectively with a reference voltage, wherein each comparator has an output connected to an input of the flip-flop; and
a switching circuit connected to the output of the flip-flop and arranged to direct (i) on a first half cycle of the clock signal, a first charging current to the first capacitor from the first current source and to direct a first biasing current to the first comparator from the second current source, and (ii) on a second half cycle of the clock signal, a second charging current to the second capacitor from the second current source and to direct a second biasing current to the second comparator from the first current source.

2. The oscillator circuit of claim 1, wherein the flip-flop comprises a SR flip-flop having an R terminal that receives the output of the first comparator, an S terminal that receives the output of the second comparator, a Q terminal that provides the clock signal and a /Q terminal that provides an inverted version of the clock signal.

3. The oscillator circuit of claim 2, wherein:
the first current source comprises a first PMOSFET having a source terminal that receives a source voltage VDD, a drain terminal connected to the switching circuit, and a gate terminal connected to a bias voltage VB; and the second current source comprises a second PMOSFET having a source terminal that receives the source voltage VDD, a drain terminal connected to the switching circuit, and a gate terminal connected to the bias voltage VB and to the gate terminal of the first PMOSFET.

4. The oscillator circuit of claim 3, wherein the switching circuit includes:
a first switch having a source terminal connected to the drain terminal of the first PMOSFET, a drain terminal connected to a first terminal of the first capacitor for providing the first charging current to the first capacitor, and a gate terminal connected to the /Q terminal of the SR flip-flop;
a second switch having a source terminal connected to the drain terminal of the first PMOSFET, a drain terminal connected to a terminal of the second comparator for providing the second bias current thereto, and a gate terminal connected to the /Q terminal of the SR flip-flop by way of a first inverter;
a third switch having a source terminal connected to a supply voltage VSS, a drain terminal connected to the drain terminal of the first switch, and a gate terminal connected to the /Q terminal of the SR flip-flop;
a fourth switch having a source terminal connected to the drain terminal of the second PMOSFET, a drain terminal connected to a terminal of the first comparator for providing the first bias current thereto, and a gate terminal connected to the Q terminal of the SR flip-flop by way of a second inverter;
a fifth switch having source terminal connected to a drain of the first PMOSFET, a drain terminal connected to a first terminal of the second capacitor for providing the second charging current to the second capacitor, and a gate terminal connected to the Q terminal of the SR flip-flop; and
a sixth switch having a source terminal connected to the supply voltage VSS, a drain terminal connected to the drain terminal of the second PMOSFET, and a gate terminal connected to the Q terminal of the SR flip-flop, wherein, (i) on a first half cycle of the clock signal, the first switch directs the first charging current from the first current source to the first capacitor and the fourth switch directs the first biasing current from the second current source to the first comparator, and (ii) on a second half cycle of the clock signal, the fifth switch directs the second charging current from the second current source to the second capacitor and the second switch directs the second biasing current from the first current source to the second comparator.

5. The oscillator circuit of claim 4, wherein:
the third switch is connected across the first capacitor; and
the sixth switch is connected across the second capacitor, wherein both of the third and sixth switches are controlled by the /Q and Q outputs of the flip-flop, respectively, and wherein the third switch is open and the sixth switch is closed on a first half cycle of the clock signal and the third switch is closed and the sixth switch is open on a second half cycle of the clock signal.

6. The oscillator circuit of claim 5, wherein the first, second, fourth and fifth switches comprise PMOSFETs and the third and sixth switches comprise NMOSFETs.

7. The oscillator circuit of claim 5, wherein:
the first comparator has a non-inverting input that receives the first charging current from the drain terminal of the first switch, an inverting terminal that receives a reference voltage VREF, and an output terminal connected to the R terminal of the flip-flop; and the second comparator has a non-inverting input that receives the second charging current from the drain terminal of the fifth switch, an inverting terminal that receives the reference voltage VREF, and an output terminal connected to the S terminal of the flip-flop.

8. The oscillator circuit of claim 7, further comprising:
a third current source for providing a first additional supply of current to the first comparator; and
a fourth current source for providing a second additional supply of current to the second comparator.

9. The oscillator circuit of claim 8, wherein:
the third current source comprises a third PMOSFET having a source terminal connected to the supply voltage VDD, a gate terminal connected to the bias voltage VB, and a drain terminal connected to the input terminal of the first comparator and the drain terminal of the fourth switch; and
the fourth current source comprises a fourth PMOSFET having a source terminal connected to the supply voltage VDD, a gate terminal connected to the bias voltage VB, and a drain terminal connected to the drain terminal of the second switch and the input terminal of the second comparator.

10. The oscillator circuit of claim 1, wherein the oscillator circuit is implemented in an integrated circuit.

11. An oscillator circuit, comprising:
a flip-flop for generating a clock signal at an output thereof;
first and second current sources;
first and second capacitors;
first and second comparators for comparing a voltage across the first and second capacitors respectively with a reference voltage VREF, wherein each comparator has an output connected to an input of the flip-flop; and
a switching circuit connected to the output of the flip-flop and arranged to direct (i) on a first half cycle of the clock signal, a first charging current to the first capacitor from the first current source and to direct a first biasing current to the first comparator from the second current source, and (ii) on a second half cycle of the clock signal, to direct a second charging current to the second capacitor from the first current source and to direct a second biasing current to the second comparator from the second current source.

12. The oscillator circuit of claim 11, wherein:
the first current source has an output connected to first and second switches; and
the second current source has an output connected to third and fourth switches,
wherein the first, second, third and fourth switches are controlled by the output of the flip-flop, and
wherein (i) on the first half cycle of the clock signal the first switch directs a charging current from the first current source to the first capacitor and the third switch directs a biasing current from the second current source to the first comparator, and (ii) on the second half cycle of the clock signal, the second switch directs the second charging current from the first current source to the second capacitor and the fourth switch directs the second biasing current from the second current source to the second comparator.

13. The oscillator circuit of claim 12, further comprising:
a fifth switch connected across the first capacitor; and
a sixth switch connected across the second capacitor,
wherein both of the fifth and sixth switches are controlled by the output of the flip-flop, and
wherein the fifth switch is open and the sixth switch is closed on a first half cycle of the clock signal, and the fifth switch is closed and the sixth switch is open on a second half cycle of the clock signal.

14. The oscillator circuit of claim 11, wherein the flip-flop comprises a SR flip-flop having an R terminal that receives the output of the first comparator, an S terminal that receives the output of the second comparator, a Q terminal that provides the clock signal and a /Q terminal that provides an inverted version of the clock signal.

15. The oscillator circuit of claim 14, wherein:
the first current source has a source terminal connected to a source voltage VDD, and a gate terminal connected to a bias voltage VB; and
the second current source has a source terminal connected to the source voltage VDD, and a gate terminal connected to the gate terminal of the first current source and to the bias voltage VB.

16. The oscillator circuit of claim 15, wherein the switching circuit includes:
a first switch having a source terminal connected to a drain terminal of the first current source, a drain terminal connected to a first terminal of the first capacitor, and a gate terminal connected to the /Q output terminal of the flip-flop;
a second switch having a source terminal connected to the drain terminal of the first current source, a drain terminal connected to a first terminal of the second capacitor, and a gate terminal connected to the /Q output terminal of the flip-flop by way of a first inverter;
a third switch having a source terminal connected to a drain terminal of the second current source, a drain terminal connected to an input terminal of the first comparator, and a gate terminal connected to the Q output terminal of the flip-flop by way of a second inverter; and
a fourth switch having a source terminal connected to the drain terminal of the second current source, a drain terminal connected to an input terminal of the second comparator, and a gate terminal connected to the Q output terminal of the flip-flop,
wherein (i) on the first half cycle of the clock signal the first switch directs the first charging current from the first current source to the first capacitor and the third switch directs the first biasing current from the second current source to the first comparator, and (ii) on the second half cycle of the clock signal, the second switch directs the second charging current from the first current source to the second capacitor and the fourth switch directs the second biasing current from the second current source to the second comparator.

17. The oscillator circuit of claim 16, wherein the switch circuit further comprises:
a fifth switch connected across the first capacitor; and
a sixth switch connected across the second capacitor,
wherein the fifth switch is controlled by the /Q output of the flip-flop and the sixth switch is controlled by the Q output of the flip-flop, and
wherein the fifth switch is open and the sixth switch is closed on the first half cycle of the clock signal, and the fifth switch is closed and the sixth switch is open on the second half cycle of the clock signal.

18. The oscillator circuit of claim 17, wherein the first, second, third and fourth switches comprise PMOSFETs and the fifth and sixth switches comprise NMOSFETs.

19. The oscillator circuit of claim 11, wherein the oscillator is implemented in an integrated circuit.

* * * * *